United States Patent [19]
Giraud et al.

[11] Patent Number: 5,846,854
[45] Date of Patent: Dec. 8, 1998

[54] ELECTRICAL CIRCUITS WITH VERY HIGH CONDUCTIVITY AND HIGH FINENESS, PROCESSES FOR FABRICATING THEM, AND DEVICES COMPRISING THEM

[75] Inventors: Andre Giraud, Levallois-Perret; Jacques Fremaux, Bonsmoulins, both of France

[73] Assignee: Compagnie Generale D'Innovation Et De Developpement Cogidev, France

[21] Appl. No.: 581,620

[22] PCT Filed: Jul. 18, 1994

[86] PCT No.: PCT/FR94/00893

§ 371 Date: Jan. 18, 1996

§ 102(e) Date: Jan. 18, 1996

[87] PCT Pub. No.: WO95/03684

PCT Pub. Date: Feb. 2, 1995

[30] Foreign Application Priority Data

Jul. 19, 1993 [FR] France .................................. 93 08836

[51] Int. Cl.$^6$ ...................................................... H01L 21/84
[52] U.S. Cl. .......................... 438/149; 438/667; 438/668; 257/59; 257/773
[58] Field of Search .............................. 437/21, 51, 203, 437/230, 245, 246; 257/59, 72, 773; 445/24, 49; 313/584; 349/58, 60, 139, 158; 438/149, 667, 668

[56] References Cited

U.S. PATENT DOCUMENTS

| | | |
|---|---|---|
| 3,942,061 | 3/1976 | Van Esdonk et al. . |
| 4,193,181 | 3/1980 | Boulanger et al. . |
| 4,352,040 | 9/1982 | Andreadakis . |
| 5,076,667 | 12/1991 | Stewart et al. . |
| 5,163,220 | 11/1992 | Zeto et al. . |
| 5,244,427 | 9/1993 | Umeya ........................ 445/24 |
| 5,247,191 | 9/1993 | Yamazaki et al. .................. 257/72 |
| 5,286,927 | 2/1994 | Ueno et al. . |
| 5,317,432 | 5/1994 | Ino ............................ 257/72 |
| 5,555,240 | 9/1996 | Nishi et al. ..................... 349/158 |

FOREIGN PATENT DOCUMENTS

| | | |
|---|---|---|
| 60-13562 | 2/1985 | Japan . |
| 1-81262 | 3/1989 | Japan . |
| 1-167729 | 7/1989 | Japan . |
| 2-16790 | 1/1990 | Japan . |
| 5-94788 | 4/1993 | Japan . |
| 5-265040 | 10/1993 | Japan . |
| 5-266978 | 10/1993 | Japan . |
| 2 054 259 | 2/1981 | United Kingdom . |

OTHER PUBLICATIONS

Patent Abstracts of Japan, vol. n. 017 No. 234 (E–1362) 12 May 1993 and JP,A,04 363 092 (Oki Electric Ind Co) 15 Dec. 1992.

Patent Abstracts of Japan, vol. 14, No. 273, (E–940) (4216) 13 Jun. 1990 and JP,A,02 086 189 (Mitsubishi Electric Corp.) 27 Mar. 1990.

L. Berenbaum "Processing Technique For Gas Discharge Panels," IBM Technical Disclosure Bulletin, vol. 18, No. 5, Oct. 1975, New York US pp. 1527–1528.

*Primary Examiner*—Kevin Picardat
*Assistant Examiner*—Leon Radomsky
*Attorney, Agent, or Firm*—Pravel, Hewitt & Kimball

[57] ABSTRACT

This circuit comprises an insulating substrate covered on at least part of its surface by a fine conducting layer (7) whose geometrical form corresponds to the layout chosen for the circuit; the said conducting layer having one or more very fine grooves (9) with a depth of more than 1 μm engraved in the substrate; the groove or grooves (9) being completely filled by at least two superimposed components: the first, situated at the bottom of the groove, consisting of a highly conductive material, (conducting wire or conducting section, or a conducting substance produced by treatment of a liquid, powdery or pastelike precursor material previously positioned in the groove); the second, which seals the groove, being produced by treatment of a liquid powdery or pastelike precursor material (11), which may or may not be conducting; the treatments having imparted to the said precursor materials their solid consistency and their final properties; the conducting layer (7) being deposited in such a way that it is in contact with the conducting components(s) positioned in the groove before filling, at an intermediate stage, or after the sealing of the groove.

13 Claims, 6 Drawing Sheets r = 12:1
α ≅ 5°

ELECTRICAL CIRCUITS WITH VERY HIGH CONDUCTIVITY AND HIGH FINENESS, PROCESSES FOR FABRICATING THEM, AND DEVICES COMPRISING THEM

FIELD OF THE INVENTION

The present invention relates to electrical circuits with very high conductivity and high fineness, and to the processes used to fabricate them. The term "conductivity" essentially implies electrical conductivity, but circuits made according to the present invention can, if necessary, be used for their thermal conductivity and contribute to the transport of calories.

BACKGROUND OF THE INVENTION

The invention also relates to devices comprising these circuits, such as electrochromic devices, operated in matrices or in segments, for the modulation of light, such as devices for variable reflection or variable transmission of light, or for the display of signals and images, for example alphanumeric or graphic data, as well as electroluminescent or liquid crystal display devices; glazing having variable optical properties (windows, screens, windscreens), valves, variable -transparency spectacles, variable-reflection mirrors; electric heating devices using power current (radiators or convectors, panel heaters); and electronic power circuits, for example amplifier output circuits. In these devices, the electrical circuits frequently have to be very fine so that they can be transparent and/or have a high density of conducting elements on a given surface.

At the present time, these electrical circuits are fabricated by a wide range of processes, of which the best known are:

(a) the engraving, for example by acid etching, of conducting layers (of copper, for example) deposited on non-conducting substrates such as sheets of plastic material which may or may not be fibre-reinforced, or glass plates;

(b) the deposition, by appropriate printing processes, on various non-conducting substrates, of conducting tracks consisting of conducting inks or pastes, these tracks corresponding to the circuit design;

(c) the deposition, by various processes of spraying or deposition in the vapour phase, of a conducting layer on a surface on which a mask has previously been deposited; the mask covers the areas of the non-conducting surface on which the conducting layer is not to be deposited, and the circuit appears after the removal of the mask by a suitable process, for example by chemical etching; a process of this category, namely photolithography, is used in particular for the fabrication of very fine circuits.

However, these known processes do not enable a number of conditions necessary for making certain electrical circuits to be met simultaneously. For example, photolithography, which can be used to make circuits with a very low thickness and very high fineness, cannot simultaneously provide a high linear conduction for the conductors of the circuit, owing to their very low thickness. Other processes, such as printing processes (screen printing, offset, etc.) cannot provide a sufficient fineness of the printed lines; moreover, they cannot provide a very fine separation of each conducting line from the adjacent line. This difficulty becomes even greater if the conducting area is to be coated with a layer designed to protect it from contact with a corrosive or conducting medium which might attack or short-circuit it. In order to deposit the conductor and then cover it with one or more protective layers, a number of successive passes must be made, positioned correctly with respect to each other, and it is even more difficult to obtain the desired fineness.

In certain cases, it is desirable to obtain at the same time an excellent linear conductivity, a surface whose roughness is close to zero after installation of the circuit, and protection of the circuit. This objective is not attainable with printing processes which, in order to obtain high conductivity, must deposit a thick layer which then forms an unacceptable relief on the surface of the substrate.

Certain supplementary conditions are sometimes required, and further increase the difficulty of the problem: for example, the production of circuits with large dimensions (practically inaccessible to photolithography), or the provision of a contact between the deposited circuit and a very thin adjacent conducting layer, to ensure, for example, uniformity of the electrical potential along the columns (or lines) used in the matrix operation of flat display screens.

The columns (or lines) of these screens are used to introduce data necessary for the operation and the supply of information relating to the pixels located along each column. These columns are formed on the surface of a glass plate by conducting bands resulting from a deposition of metal or oxide which, in order to be transparent, has to be very thin (generally less than one micron) and is consequently a very poor conductor. For example, for a display device only 3 cm wide, an indium tin oxide (ITO) column with a width of 500 microns produces a resistance of 300 ohms, which is unacceptable in the case of devices using a very high inrush current (several A per $dm^2$). This low conductivity causes a large potential difference along the column, which may create serious problems if the screen is of large dimensions: the operation of the pixels in the centre becomes very different from that of the pixels located at the periphery. It therefore becomes necessary to install, along the transparent column, a fine thick opaque conducting line, located in the black matrix between the pixels, and in contact for the whole of its length with the column whose conduction it reinforces. However, another difficulty then arises. The fabrication of the screen by certain processes, such as those based on liquid crystals using certain effects (twisted nematic and derivatives: STN, smectic A, smectic C*, ferroelectric, etc.) entails a high regularity of the interface between the electrodes. Thus, in the case of liquid crystal display (LCD) devices, the space must be 5 microns with an accuracy of ±0.2 micron, or even of the order of one micron for ferroelectric liquid crystals. This is incompatible with making reinforcing conductors by deposits on the surface of the glass which cannot be wide if they are to be invisible and which must be in relief if they are to be conducting.

Furthermore, for some processes, for example certain electrochromic processes, the layer interposed between the electrodes has corrosive properties, making it necessary to form the reinforcing conductors in such a way that they are in electrical communication with the transparent conducting layer while being protected from the corrosion caused by the luminophore layer.

The description of this problem illustrates its complexity and difficulty, to which must also be added the necessity of using a convenient and fast process to obtain the most favourable production costs.

Figure 1A:
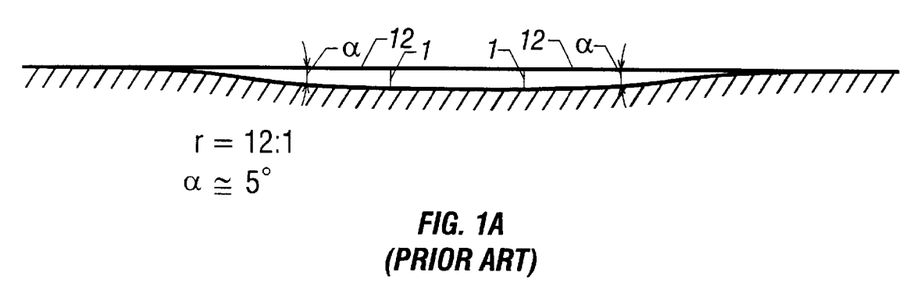
FIG. 1, to which reference was made above, represents schematically sections of a groove according to the prior art and according to the invention.
Figure 1B:
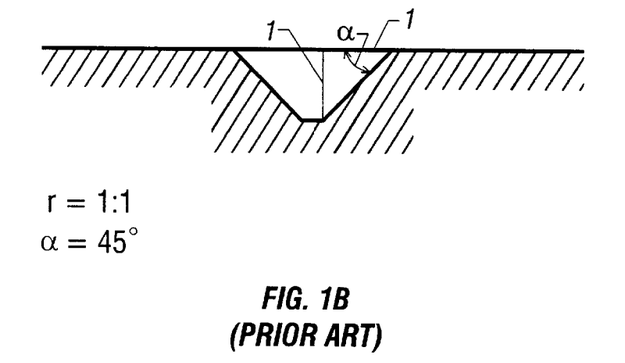

There is a known process, described in U.S. Pat. No. 5,163,220, for raising the electrical conductivity of strips of ITO electrodes in thin film electroluminescent (TFEL) display panels. According to this process, grooves are created in the electrode substrate by chemical etching (using a solution of HF and ammonium fluoride), and these grooves are filled by cathode sputtering with successive layers of titanium, silver and then titanium again (barrier layer). The chemical etching is carried out after the plate has been heated, enabling the grooves to be made less open, the inclination α of the side walls changing from less than 5° to the limit value of 45° (in other words, as shown in FIGS. 1a and 1b, the lateral to vertical etching ratio r changes from approximately 12:1 to 1:1). With the etching technique described, the depth of the grooves does not exceed 1 μm in practice. The grooves are filled by cathode sputtering, which only enables very thin layers to be deposited. The ITO strips are deposited subsequently to cover the grooves.

Because of the shallowness of the grooves and the thinness of the layers which can be made in practice by cathode sputtering, only limited conductivity can be achieved with the process described in this U.S. patent.

SUMMARY OF THE INVENTION

The object of the present invention is to propose a solution by which it is possible to make, on substrates of insulating material such as mineral or organic glass, circuits with very high conductivity, particularly circuits comprising very fine lines or lines separated by very fine insulating lines, which may advantageously be protected chemically from any attack by corrosive elements, and whose transparency is not significantly affected by the reinforcing conductor.

For this purpose, it is proposed, according to the present invention, to form grooves with a relatively large depth, advantageously delimited by steep side walls. It then becomes possible to use filling profiles with a relatively large section, permitting high conductivity. Moreover, this filling is carried out by techniques which are much easier to apply than cathode sputtering, such as the application of pastes, powders, etc., making it possible to install very varied combinations of relatively thick conducting and/or protective layers and/or conducting wires, and consequently to adjust the conductivity according to the environment of the circuit, and also permitting different combinations of these fillings with a thin layer forming the circuit, ensuring the best contact with this thin layer.

The initial object of the present invention is therefore an electrical circuit with very high conductivity and high fineness, designed in particular to form part of light modulation or display devices of different kinds such as electroluminescent, electrochromic or liquid crystal devices, glazing and valves with variable optical properties, electric heating devices using a power current and electronic power supply circuits, the said circuit comprising:

a substrate made of insulating material;

covered on at least part of its surface by a fine conducting layer whose geometrical form corresponds to the layout chosen for the electrical circuit;

the said conducting layer having one or more very fines grooves with a depth of more than 1 μm engraved in the substrate;

the said groove or grooves being completely filled by at least two superimposed components:

the first, situated at the bottom of the groove, consisting of a highly conductive material, namely either a conducting wire or a conducting section, or a conducting substance produced by treatment of a liquid, powdery or pastelike precursor material previously positioned in the groove, the said treatment having imparted to the said precursor material its solid consistency and its final properties;

the second, which seals the groove, being produced by treatment of a liquid, powdery or pastelike precursor material, which may or may not be conducting, the said treatment having imparted to the said precursor material its solid consistency and its final properties;

the conducting layer being deposited in such a way that it is in contact with the conducting component(s) positioned in the groove, before filling, at an intermediate stage, or after the sealing of the groove.

The term "fine conducting layer" shall be taken to mean a layer whose thickness generally varies from 0.05 μm to 0.6 μm.

Figure 1C:
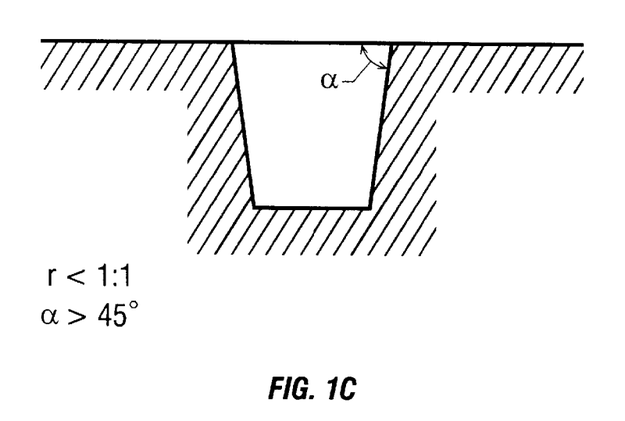

According to a particularly preferred characteristic, the lateral to vertical engraving ratio r of the groove or grooves is less than 1:1 (the side walls are inclined at more than 45°, as illustrated in FIG. 1c).

The term "very fine grooves" shall be taken to mean grooves having a mean width generally lying between approximately 15 and 80 μm, although these dimensions shall not be considered critical. On the other hand, as a general rule, the depth of the grooves is greater than 6 μm, being in particular greater than 15 μm and possibly up to 100 μm.

It may be emphasized here that the present invention, which enables grooves having a depth of several tens of μm and fillings also having depths of several tens of μm to be made, also permits reinforcing conductors for the fine conducting layer positioned on the substrate which are hundreds of times larger than in the case of the cited U.S. Pat. No. 5,163,220.

The substrate may be in various shapes and the grooves may be disposed in a wide variety of arrangements. Among others, it is possible to mention the case of a flat substrate and rectilinear grooves disposed parallel to each other and interacting with a conducting layer which coats the substrate and which is continuous or in the form of strips parallel to the grooves, with the possibility of associating at least one groove with one strip. It is also possible to mention circuits enabling current to be supplied to large pixels cut in a conducting layer, or for other electronic applications where a high current density is required in certain parts of the substrate surface.

The conducting wires may comprise a protective conducting coating, and the said coating may also have undergone, after the installation of the wire, a treatment which consolidates it and gives it its final properties.

The precursor materials of the conducting substances are described subsequently with reference to the processes according to the invention. It will be noted that the precursor material used to form the groove sealing layer may be a poor conductor or even non-conducting, in which case the contact between the fine conducting layer and the groove filling is made at the level of the conducting layers of the groove.

It is also possible to envisage a case in which the different layers filling the groove are formed from the same precursor material, in which case it might be impossible to distinguish them on completion of the treatments putting these materials into their final form.

The conducting part of the circuit according to the invention therefore consists of at least one conducting substance applied in the groove or grooves without forming a relief on the surface of the substrate, and a continuous or discontinuous conducting layer deposited on the support, the conductor or conductors filling the groove or grooves being disposed so that they form supplementary means for supplying current to the conducting layer, means being provided to ensure electrical communication between the said layer and these supplementary current supply means.

In the latter case, the means providing electrical communication between the conducting layer and the supplementary current supply means may be formed by an extension of the said conducting layer on the internal wall of the groove, or on the upper surface of the said conducting part located in the groove, or by conducting strips disposed so that they connect the conducting layer to the upper surface of the conducting part located in the groove. If the conducting layer is discontinuous, the discontinuity may be created by a deposition of the layer in discontinuous parts or by notches or channels made in the substrate, passing through the said layer or lying on one of the upper edges of the grooves in such a way that it exposes the insulating material forming the substrate, the said notches or channels possible being filled by a non-conducting material which restores the surface continuity of the said substrate.

The present invention also relates to a process of fabrication of an electrical circuit as specified above, characterized in that:

the groove or grooves are engraved, according to the chosen circuit layout, in the surface of a substrate made of insulating material, coated if necessary with a thin conducting layer, with possible subsequent deposition of a thin layer of conducting material on the parts or on the whole of the surface of the substrate, including grooves, if the said substrate has not been previously coated;

the grooves are filled by the introduction of at least one layer of precursor material of the conducting layer, which may be a dust or of a liquid to paste-like consistency, appropriate for being applied in the said grooves, and/or by the direct positioning of a conducting wire which may be provided with a conducting coating, or of a conducting section, the filling being completed if necessary by a layer of material in the form of dust or having a liquid to paste-like consistency, which is the precursor of a conducting or non-conducting protective layer which is neutral with respect to its environment;

after the positioning of at least one precursor material, this material is appropriately treated to give it its final shape, consistency and properties, a thin layer of conducting material, in the case of a previously uncoated substrate, possibly being deposited during the filling of the grooves, on parts or all of the substrate, including grooves, between two layers of filling of the grooves, or deposited after the filling of the grooves on parts or all of the substrate; and in the case in which the external thin layer has to be discontinuous, notches or channels are formed in such a way as to expose the substrate of insulating material, according to the chose circuit layout, the notches or channels possibly being filled subsequently by a non-conducting material.

In order to engrave steep-sided grooves according to the invention in the surface of the substrate, a thermal, mechanical-thermal, mechanical, mechanical-chemical or electric process may be used.

(1) The use of a laser, for example a UV excimer laser, may be cited as a thermal process. This method has the advantage of permitting the engraving of extended and complex circuits with a minimum of manipulation of the substrates and with a high production rate. In this way it is possible to obtain very fine grooves positioned with high precision and with a very clean profile.

(2) Pressing, injection and upsetting may be cited as mechanical-thermal processes. In the case of pressing, a drop of glass (a parison), delivered from a feed device, falls freely on to the base of a mould, after which a punch having ridges designed to form the grooves presses the drop of glass while engraving the imprint of the punch in the soft glass. In the case of injection, a drop of glass is received in a piston which injects the glass into a closed mould by the effect of pressure. In the case of upsetting, a sheet of glass having the final dimensions is preheated gently to above the softening point, and is then subjected to a pressure which stamps the engraving.

(3) The mechanical processes are sandblasting, lapping and grinding. In the last case, a grinding wheel or circular saw is used. Progress made in recent years in this field and in the corresponding machines is such that it is entirely possible to obtain the necessary precision and fineness and to avoid breaking the substrates.

(4) High-pressure water jets and ultrasonic machining may be cited among the mechanical-chemical processes.

(5) Erosion caused by the contact of the glass with a platinum wire brought to red heat by the Joule effect may be mentioned as an electrical process. This process is known under the name of Planteé and a variant of it is known under the name of Phelps (see Nouveau Manuel Complet du Verrier, Julia de Fontenelle and F. Malepeyre, Volume II, pages 41–43).

The successive layers of precursor material can advantageously be installed by application of a substance in dust form or having a liquid to paste-like consistency of the precursor material on the surface of the substrate bearing the grooves and the removal of the substance which has not penetrated into the grooves, or by application of a paste or ink with a squeegee or with the aid of an inking roller, possible after the execution of a treatment, before the formation of the grooves, designed to make the surface of the substrate non-wettable by the ink, so that the applied ink flows virtually exclusively into the grooves.

One example which may be mentioned is the use of a metal powder, such as a zinc, tin, or silver powder, which is made into a paste with water by mixing with the precise quantity of water necessary to fill the voids between the grains (grains with a diameter significantly smaller than the width and depth of the grooves are used). These pastes have approximately the viscosity of toothpaste and may be positioned in the grooves with a simple rag or an inking roller.

The use of an ink, such as an ink suitable for screen printing, may also be mentioned, for example the "hybrid thick film" technology. Such inks may be, for example, vinyl, phenol or epoxy inks, based on silver, copper or gold, etc., whose viscosity has been adjusted to enable them to be applied by screen printing. They may conveniently be positioned in the grooves by using a squeegee as in screen printing.

It is also possible to apply in the grooves metal wires, for example copper wires, whose diameter is smaller than the depth of the groove. This operation which is relatively delicate is performed better if the wire is coated with a fine protective layer, for example a layer of thermoplastic or thermosetting polymer. Since the wire has to be in electrical contact with the exterior, the polymer is filled with powder, such as graphite or conducting carbon, so that it becomes a conductor itself. A complementary layer, for example one consisting of the same polymer which may be a conductor, is added to finish the filling of the groove. If necessary, gentle polishing enables a uniform surface to be restored.

Finally, the precursor material applied in a groove is given its final shape and/or structure by fusion to reconstitute the analogue of a metal wire by heat treatment by microwaves or infrared radiation, in the case of a metal powder or a metal powder made into a paste with water or a conducting ink; by drying in the case of a paste or ink of the type used in screen printing or of the type filled with carbon to form a conducting adhesive, by the evaporation of the water or solvent contained in it; or by polymerization or setting in the case of polymerizable compounds or thermosetting polymer compounds.

If a metal powder is used, in its original form or in the form of a paste made with water, the fusion reconstitutes a true metal wire having the corresponding conductivity. This fusion is advantageously performed in a reducing atmosphere, for example $N_2+5\%$ by volume of $H_2$. In the same way, a conducting ink based on a metal powder (copper, for example) can be treated in a microwave oven to form the conductor after the grooves have been filled.

If a metallic paste or ink of the type developed for use in screen printing has been used, drying may be carried out to obtain a solid layer where conductivity will be lower than that of solid metal, but may suffice in many cases.

It is also possible to use, by the same technique, polymer inks filled with carbon or conducting adhesives or polymer compounds filled with metal powders, which have the advantage of being passive in relation to any physical and chemical attack, even if their conductivity is somewhat lower. Moreover, they may be used in particular to protect the conductors created by the other methods indicated.

It is also possible to make one of the filling layers by chemical deposition or electrolytic deposition. For example, the bases of the grooves may be made conducting by chemical precipitation, tin-plating, silver-plating, gold-plating, platinum-plating, copper-plating, etc., and this deposit may be used if necessary as the starting electrode to grow a thicker layer, of copper for example, by electrotyping. If necessary, it is also possible to deposit fine layers, of $SnO_2$ or ITO for example, by cathode sputtering or by a CVD process. However, this is not to be preferred, since these techniques can only be used to produce a few hundred nanometers of metal plating, whereas the grooves according to the invention have a depth of more than 1 micron.

Finally, the present invention is also applicable to the devices comprising the circuits as described above.

Devices which may be mentioned include a light modulation device, such as an electrochromic device for light modulation, a display device with liquid crystals and the other types cited above, glazing or a valve with variable optical properties comprising two substrates of which one carries a circuit of electrodes and the other a circuit of counter electrodes, the two circuits being disposed facing each other with the interposition of a luminophore layer, in which case at least one of the two electrode circuits is as specified above. As devices of this type, illustrated below, it is possible to cite screens or display units consisting of cells operated in a matrix mode, the circuits of electrodes and counter electrodes consisting respectively of parallel conducting columns and parallel conducting lines, disposed perpendicularly to the columns, at least the electrode circuit conforming to the invention. It is also possible to cite glazing or valves with variable properties, also illustrated below, both of whose circuits conform to the invention, with the possibility of providing means to ensure the independent control of the potential of the conducting parts of each groove and, if necessary, of the external conducting layer associated with the groove if this layer is discontinuous.

BRIEF DESCRIPTION OF THE DRAWINGS

To illustrate further the object of the present invention, some embodiments of the invention are described below, for information and without restriction, with reference to the attached drawing.

In this drawing.

each of FIGS. 3 to 6 illustrates a process of fabricating a variant embodiment of this electrode circuit, showing, in each case, the successive stages of formation of the columns on part of the base plate, represented on an even larger scale.

each of FIGS. 7 to 9 illustrates, in transverse section, another possible variant embodiment of the conducting part filling a groove of this electrode circuit.

DETAILED DESCRIPTION OF THE INVENTION

Figure 2:
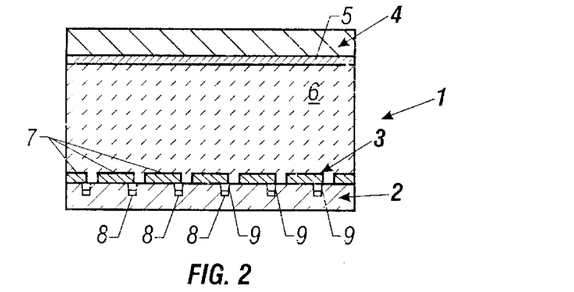
FIG. 2 is a partial schematic view, in transverse section, on an enlarged scale, of an electrochromic matrix screen whose electrode circuit forming the columns of the screen is made according to the present invention.

If reference is made initially to FIG. 2, it will be seen that an electrochromic matrix screen 1, having a known structure, is represented, and comprises a first transparent supporting plate 2 carrying the operating electrodes 3 which are transparent, and a second supporting plate 4, separated transversely from the plate 2 and carrying counter electrodes 5, the plate 4 and the counter electrodes 5 possibly being made of transparent material, at least one layer 6 of electrolytic material whose composition exhibits electrochromism (luminophore or chromogenic material) being disposed between the electrodes 3 and the counter electrodes 5.

The transparent plate is made from mineral glass or organic glass. Some types of organic glass which may be mentioned are, in particular, polymethylmethacrylate, polycarbonates, aminoplastics, urea resins and allyl resins; polyesters and polyurethanes may also be mentioned.

The electrodes 3 are in the form of conducting strips 7, also called "columns" of the screen, are transparent and parallel and have a thickness varying from a few hundred to a few thousand angstroms, with a width varying from 200 to 500 $\mu$m, separated by intervals of 20 to 100 $\mu$m, which represent what is known as the "black matrix"; the transparent conducting layer forming the strips 7 consists of one or more metals or oxides, such as gold, silver, tin oxide (TO), mixed indium and tin oxide (ITO), zinc oxide and cadmium stannate, etc., as mentioned in the literature; each of these columns 7 is also, along one of its edge areas, and in the various ways which will be described below, in contact with a supplementary current supply column 8, between the two ends of the associated column 7, in other words inside the screen itself. The assembly of the columns 7 and the supplementary columns 8 constitutes the conducting part of an electrical circuit according to the present invention.

The counter electrodes 5 are in the form of conducting strips parallel to each other, and are also called the "lines" of the screen, since they are disposed perpendicularly to the columns 7.

These counter electrodes 5, which are not necessarily transparent, will not be described further here. If they are transparent, it is possible for them to have the same structure as the electrodes 3 (columns 7 and supplementary columns 8).

The screen 1 is completed, in a known way, by means of supplying the electrical current to the ends of the columns 7+8 and the lines 5, and by means of applying electrical signals to these columns 7+8 and lines 5, in order to generate, under the application of an electrical signal addressed simultaneously to a line and a column a luminous effect in the luminophore material 6 at the intersection of the line and column.

The supplementary columns 8 are formed in the grooves 9 made in the surface of the plate 2, advantageously in such a way that they lie on the "black matrix" as far as possible.

Some of the possible variant embodiments of these columns 7 and 8 will now be described.

(1) A first variant is represented in FIG. 3. This uses an uncoated glass plate 2 in which parallel grooves 9, having a depth of the order of 30–100 $\mu$m and a mean width of the order of 30–80 $\mu$m, are engraved at intervals chosen according to the specified dimensions of columns 7+8, by one of the processes described above, these grooves 9 comprising, for example, a relatively flat bottom and sides flared slightly in the direction of the surface of the plate 2 (FIG. 3a).

Figure 3A:
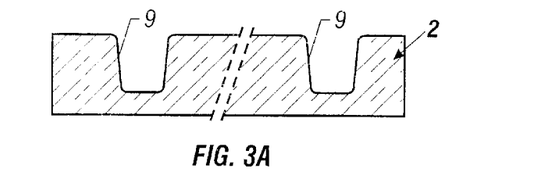
Figure 3B:
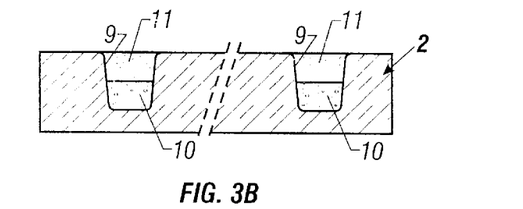

A conducting base layer 10, for example a silver or copper paste, is positioned in these grooves 9, by one or other of the techniques described above, followed by an upper protective and conducting layer 11, for example graphite or conducting carbon, the latter layer completing the filling of the grooves 9 (FIG. 3b).

Figure 3C:
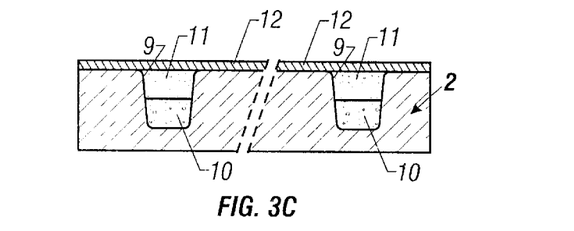

A fine layer 12, with a thickness of the order of 0.2–0.9 $\mu$m, of the conducting metal or oxide designed to form the columns 7 is then deposited on the totality of the surface of the plate 2, by cathode sputtering or the CVD process (FIG. 3c).

Figure 3D:
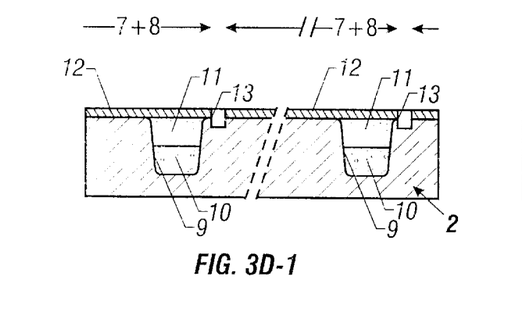

Finally, to form the columns 7+8, shallow notches 13 parallel to the grooves 9 are formed by a process such as that described above in the plate 2, at the same interval as that separating the grooves, each notch being situated in the vicinity of a groove 9 and being cut through the layer 12 and into the underlying glass to expose the insulating material of the substrate 2 (FIG. $3d_1$).

Figure 3D:
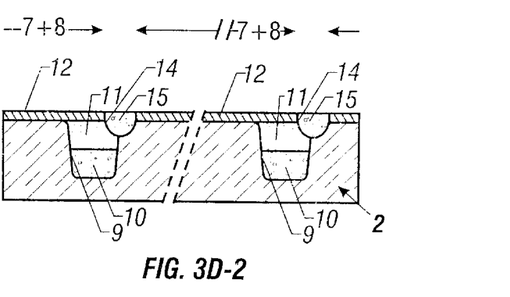

To ensure the alternation of the conducting parts and the insulating parts on the plate 2, it is also possible, as shown in FIG. $3d_a$, to form longitudinal channels 14 so that each of these lies on one of the edges of a groove 9, exposing the insulating material of the substrate 2 in part of the said channels 14. If perfect smoothness of the plate 2 is required, the channels 14 may be filled with a material 15 which is non-conducting, is advantageously transparent, and can be set, for example a thermosetting polymer.

The contact between the columns 7 and 8 is made, in the case of this variant, over the totality or almost the totality of the surface of the layer 11.

The function of the layer 11 in protecting the layer 10 from corrosion by the luminophore material 6, which is assumed to be corrosive, as is frequently the case in practice, may also be emphasized.

(2) A second variant is described with reference to FIG. 4. In this case, after the grooves 9 have been formed as in the case of the first variant (FIG. 4a), a layer 12 of the transparent conducting material which is to form the columns 7 is deposited by cathode sputtering or the CVD process, in such a way that it covers the whole of the plate 2 (FIG. 4b). The layers 10 and 11 are then applied successively as in the case of the first variant (FIG. 4c), the surfaces of the layers 11 being into alignment with the surface of the layer 12 in this case. To complete the formation of the columns 7+8, there are two possibilities, as illustrated in FIGS. $4d_1$ and $4d_2$, which are analogous to the embodiments shown in FIGS. $3d_a$ and $3d_2$ respectively. The formation of the grooves 13 and of the channels 14 with their filling material 15 will not, therefore, be described in further detail at this point.

In the case of the second variant, a column 8 (layers 10 and 11) and the associated column 7 (formed by the external adjacent strip of the layer 12) are in contact along the whole of the part of the layer 12 located inside the groove 9. In this case, therefore, the columns 7 are therefore very well supplied with current by the supplementary columns 8.

Figure 5A:
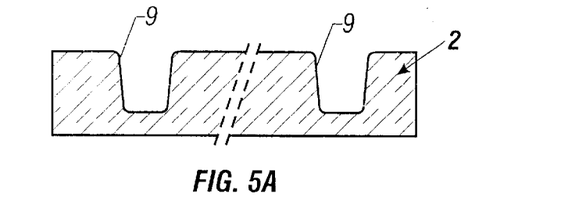
Figure 5B:
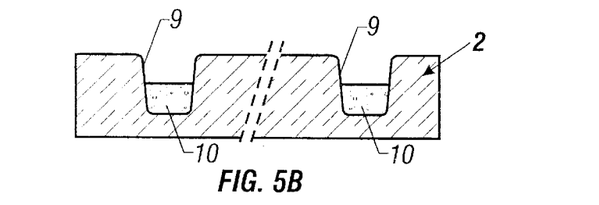
Figure 5C:
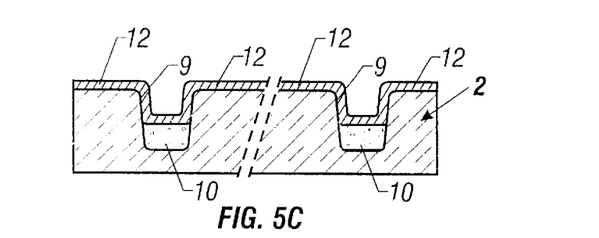

(3) A third variant is now described with reference to FIG. 5. This variant will not be described in detail, since it differs from the preceding variant only in that the layer 12 is applied over the totality of the plate 2 (FIG. 5c) after the formation of the grooves 9 (FIG. 5a) and the application of the base layers 10 (FIG. 5b). After the deposition of the layer 12, the filling of the grooves 9 with the layer 11 is completed (FIG. 5d), after which, in the same way as in the two preceding variants, either the grooves 13 are formed (FIG. $5e_1$) or the channels 14 (FIG. $5e_2$) are formed and filled by the material 15.

The electrical communication between the column 8 and the associated column 7 is very well reinforced in this case. Since part of the layer 12 is simultaneously in contact with the layer 10 and with the layer 11 within the groove 9.

Figure 6A:
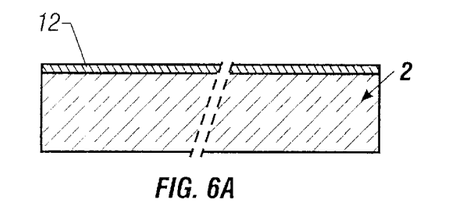
Figure 6B:
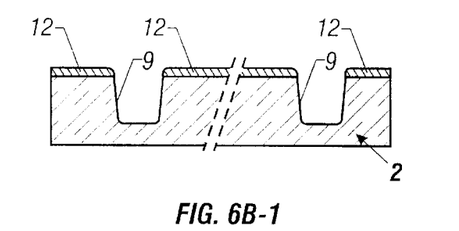

(4) A fourth variant will now be described with reference to FIG. 6. A commercially available plate 2, pre-coated with a layer 12, is used (FIG. 6a).

According to a first embodiment, illustrated in FIGS. $6b_1$ to $6e_{[1]}$, grooves 9 (FIG. $6b_1$) are formed in the pre-coated plate 2, and the layers 10 and 11 are then applied in these grooves, the layers 11 coming into alignment with the parts 12 (FIG. $6c_1$). Strips 16, having a width of 80–100 $\mu$m and a thickness of the order of 4–8 $\mu$m, of a conducting and protective material, identical to or of the same type as the material constituting the layers 11 (FIG. $6d_1$), are then deposited by screen printing so that they link the layer 12 and the surface of the layers 11. The electrical contact between the columns 7 and 8 is made in this case through the intermediary of these strips 16.

Figure 6B:
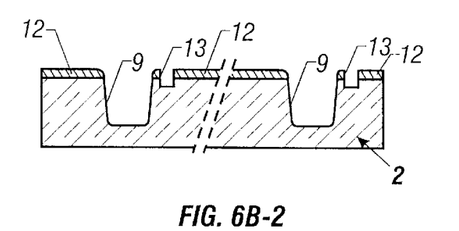
Figure 6C:
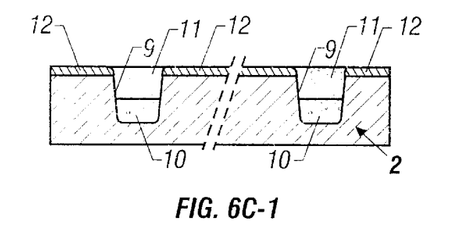
Figure 6C:
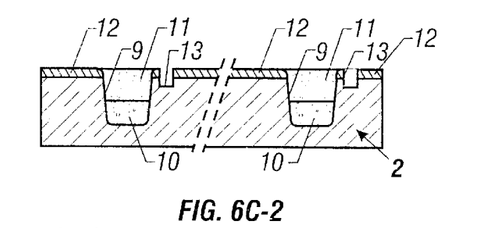
Figure 6D:
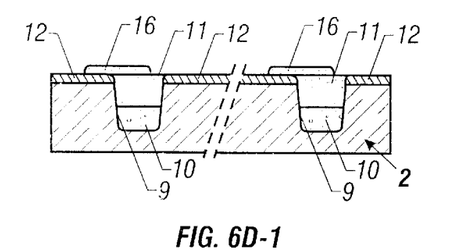
Figure 6D:
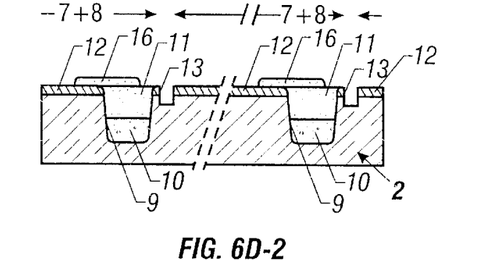
Figure 6E:
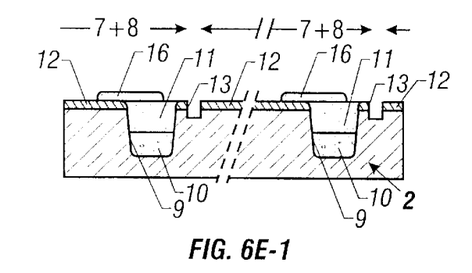
Figure 6E:
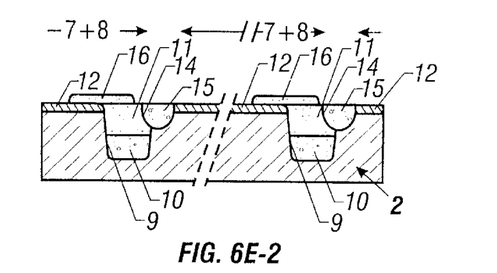

Finally, either notches 13 or channels 14 are formed as in the case of the preceding variants (FIGS. $6e_1$ and $6e_2$ respectively).

According to a second embodiment, illustrated in FIGS. $6b_2$ and $6d_2$, the grooves 9 and the notches 13 are formed simultaneously at the outset (FIG. $6b_2$). The layers 10 and the layers 11 are then applied successively in the grooves 9 (FIG. $6c_2$), care being taken not to fill the notches 13. For this purpose, it is possible, for example, to deposit at the bottom of each of these notches 13 a wire of a plastic type whose diameter matches the width of the notch. After the operations of filling the grooves 9, the wires are extracted, thus freeing the said notches.

Figure 7:
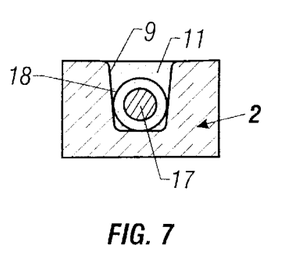
Figure 8:
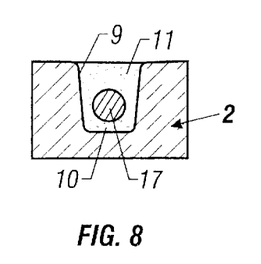
Figure 9:
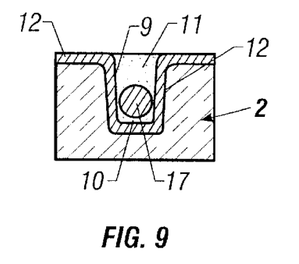

FIGS. 7 to 9 show other embodiments of the filling of the grooves 9, which may be used in one of the variants which were described above. Those skilled in the art will understand that there are also other possibilities for filling the grooves 9, for example by combining these embodiments with each other.

In the groove 9 according to FIG. 7, a conducting wire 17 having a diameter of the order of 30–70 $\mu$m is installed, and is coated with a conducting and protective layer 18, for example a polymer filled with a conducting powder, the diameter of the coated wire being approximately equal to the width of the groove 9 at mid-depth, or alternatively being smaller. The filling is completed by the application of a conducting and protective paste 11 of the same type as the layer 11 in the variants shown in FIGS. 3 to 6. This variant of the filling of the groove 9 may replace, for example, those shown in FIGS. 3 to 6.

In the case of the variant shown in FIG. 8, a conducting layer 10 of the same type as the layer 10 in the variants shown in FIGS. 3 to 6 has been applied in the bottom of the groove 9, after which an uncoated conducting wire 17 has been positioned and the filling has been completed with a conducting and protective layer 11. This variant of the filling of the groove 9 may replace, for example, those shown in FIGS. 3, 6 and 7.

The groove 9 shown in FIG. 9, covered with a layer 12, as in FIGS. 4 and 6, has a filling identical to that shown in FIG. 8. It would also be possible to envisage, for example, a filling of the type shown in FIG. 7.

Figure 10:
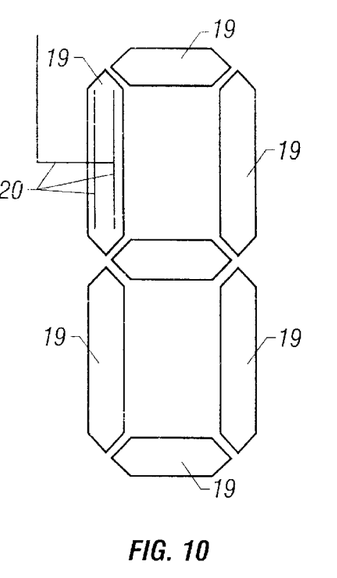
FIG. 10 is a schematic view of a direct addressing display panel element comprising an electrical circuit according to the present invention; and each of FIGS. 11 and 12 represents a partial schematic view in transverse section at the enlarged scale of glazing having variable and controllable optical properties comprising electrode circuits according to the present invention.

FIG. 10 shows schematically the seven chromophore segments 19 (or large pixels) of a known display panel of the direct addressing type, designed to display an alphanumeric character. Each of these segments 19 consists of a layer of electrolytic material situated between a working electrode layer, consisting of tin oxide for example, and a counter electrode layer. A current supply and reinforcement circuit 20, made according to the invention with grooves made in the associated substrate and filled with conducting material, such as a copper- or silver-based adhesive or ink which may be protected, has also been shown schematically for one of these pixels. A circuit of the same type is associated with each pixel. This figure shows a disposition of grooves different from that with parallel rectilinear grooves.

Figure 11:
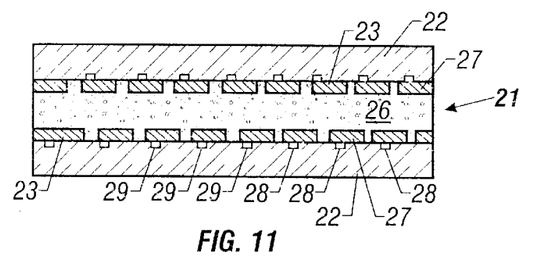

If reference is made now to FIG. 11, it will be seen that this shows glazing with variable properties, consisting, in a known way, of two glass substrates 22, spaced apart, each of which carries a circuit of electrodes 23, the electrodes 23 being disposed facing each other with the interposition of a luminophors layer 26, for example one comprising in a known way a transition metal salt, such as $WO_3$ (electrochromic layer) or liquid crystals dispersed in a polymer (PDLC).

The structure of the electrodes 23 is practically analogous to that of the "columns" of the screen shown in FIG. 2; in other words, the electrodes consist of parallel conducting strips 27, made for example of TO or ITO, each having its conductivity reinforced by a conducting part 28 filling a groove 29, and with the whole of its upper surface in communication with the associated strip 27.

The grooves 29, practically of the same size as the grooves 9 described previously, are parallel to each other and spaced equally at intervals of 50 to 1000 μm, and are made in the two plates 22, the grooves 29 of one plate being staggered by one half-interval with respect to the grooves 9 of the other plate. However, any other relative disposition of the grooves 29 may also be envisaged.

Different modes of filling the grooves 29 are possible, such as those shown in FIGS. 3 to 6, $3d_1$ or $3d_2$, or $4d_1$ or $4d_2$, or $5e_1$ or $5e_2$, or $6e_1$, $6e_2$, or $6c_2$ or $6d_2$, 7, 8 and 9.

The strips 27 have a width of the order of 200–1000 μm and they are spaced apart by an equal distance of the order of 50–200 μm. Additionally, although the strips 27 formed on one plate 22 are represented in FIG. 11 as being disposed in a staggered arrangement with respect to those of the other plate 22, other dispositions are possible. In the glazing shown in FIG. 11, it is possible to control the potential of the strips 27+28 independently.

Figure 4C:
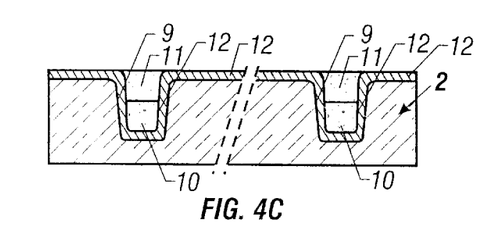
Figure 4D:
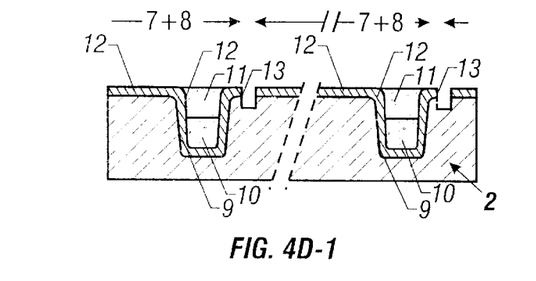
Figure 5D:
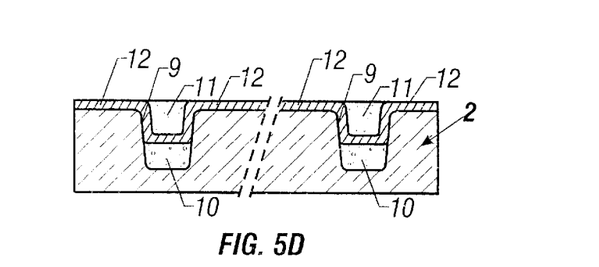
Figure 5E:
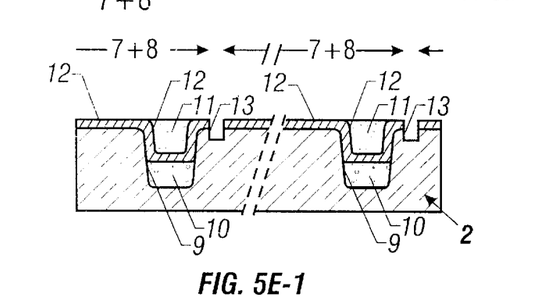
Figure 5E:
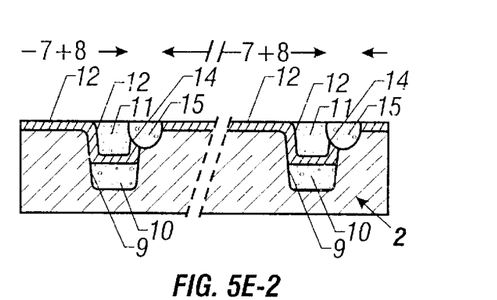
Figure 12:
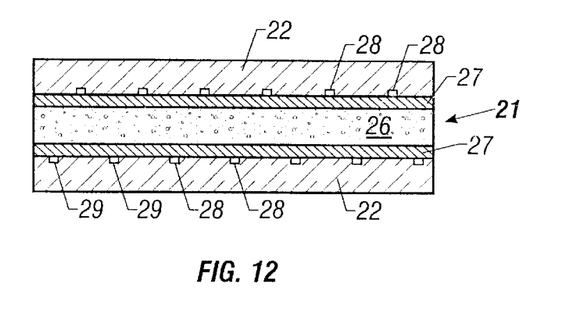

FIG. 12 shows another variant embodiment of glazing with variable properties, which differs from the preceding embodiment in that the strips 27 are replaced by continuous layers, permitting only one equipotential voltage control on each layer 27. In this case, the conducting parts 28 allow the uniformity of the colour to be improved over the whole of the glazing 21. FIGS. 3c, 4c, 5d, $6c_1$ and $6d_1$ show other possible structures for the combination of the plates 22 and the electrodes shown in FIG. 12, also in combination with the variants shown in FIGS. 7 to 9.

The following examples provide further illustrations of the present invention.

EXAMPLE 1

(See FIG. 3b)

In a 2 mm thick glass plate 2, previously surface treated by spraying a commercially available hydrophilic product, grooves 9, with a mean width of 35 μm and a depth of 30 μm, were formed with the aid of a "DISCO DAD 2 H6/T" saw using diamond-impregnated blades. This saw, which is commonly used for cutting silicon chips, has a precision of the order of a micron in each of the three dimensions. In this way a very regular network of 150 parallel grooves 9, spaced 350 μm apart, was created.

Several layers of a silver paste (ACHESON, DEMETRON, MINICO) were deposited in these grooves 9 with a screen printing squeegee, giving a total thickness of 25 μm. After firing at approximately 120°–150° C., conducting parts 10 having a resistance of approximately 4 ohms per 3 cm of width of the plate were obtained in the grooves 9. The filling of the grooves 9 was then completed by the deposition of a layer 11 of protective graphite-impregnated ink (MINICO series 5000) (25 Ω/cm per 10 μm of thickness), which was heat polymerized.

Corrosion tests have shown that the conducting network formed in this way was completely protected from corrosion by an environment with pH 2.

EXAMPLE 2

(See FIG. 8)

Grooves 9 having a width and depth of approximately 50 μm were created by the same process as in Example 1 in a 2 mm thick glass plate 2, at intervals of 500 μm.

A layer 10 of carbon-impregnated ink with a thickness of 10 μm was deposited on the plate by the technique described in Example 1. Before the ink 10 was dried, copper wires 17 with a diameter of 30 μm were applied in the grooves 9 with the aid of a "Wedge Bonding" instrument of the KULICKE and SOFA or PRECIMECA type, making it possible to carry out a first soldering on a metal substrate external to the glass plate 2, to extend the wires 17 in the grooves 9, and then to carry out a second soldering while extending and cutting the wires 17. In this way a hundred wires 17 were disposed in the grooves 9. The filling of the grooves was then completed with layers 11 of protective graphite-impregnated ink of the same type as that used in layer 11 in Example 1.

In this way resistances of the order of 0.06 Ω/cm of length of the groove were obtained.

EXAMPLE 3

(See FIG. 11)

In a 2 mm thick glass plate 22, previously surface treated by a commercially available hydrophobic product, parallel grooves 29 with a width of 30 μm and a depth of 30 μm were engraved at intervals of 300 μm with the aid of a LUMONIX EXCIMER UV laser, using a wavelength of 193 nanometers and pulses of 10 to 30 ns at a frequency of 200 Hz. A digitally controlled positioning table enabled this process to be carried out with an accuracy of 1 μm.

The grooves 29 obtained in this way were then filled to half their depth with a metal paste obtained by mixing tin powder and lead powder in a ratio of 60/40 by weight with a precisely sufficient quantity of water. The conducting parts were formed by fusion of the powders by heating the plate 22 in a furnace with a reducing gas circulation (for example, 4% hydrogen in nitrogen) at a temperature above the melting point of the metal powders constituting the paste.

The filling of the grooves is completed with a conducting carbon-impregnated ink by the method described in Example 1. A layer of ITO covering the glass 22 and the filled grooves 29 is then deposited by cathode sputtering. This is then engraved by known methods into strips 27, parallel to the grooves, 250 μm wide and spaced 50 μm apart, the strip 27 lying on top of the groove.

Two identical glass plates are disposed facing each other, so that the grooves 29 of one plate are staggered by a half-interval with respect to the grooves 29 of the other plate. These two glass plates encapsulate an adhesive coated transparent linking polymer in which liquid crystals are dispersed. This cell, assembled in the above way, forms glazing with variable properties which are controllable over all or part of the surface according to the electrical connections made.

EXAMPLE 4

(See FIG. 4)

Figure 4A:
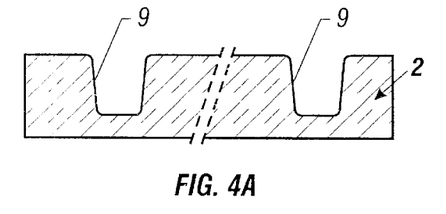
Figure 4B:
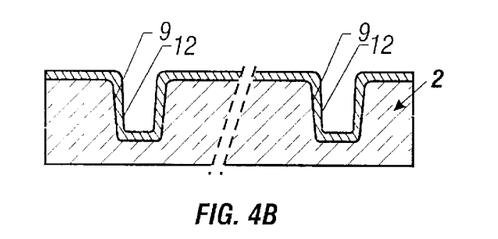

In a 2 mm thick glass plate 2, parallel grooves 9 separated by intervals of 350 μm were created by the process described in Examples 1 and 2, with the aid of an 80 μm diamond-impregnated blade to a depth of 30 μm (FIG. 4a).

The plate 2 was then subjected to a cathode sputtering treatment, which covered it entirely, including the internal walls of the grooves 9, with a fine layer 12 of transparent tin oxide 0.4 μm thick (FIG. 4b).

A silver layer 10, followed by a layer of protective graphite-impregnated ink 11 which had been polymerized, was then applied in the grooves 9 by the process described in Example 1 (FIG. 4c).

Figure 4D:
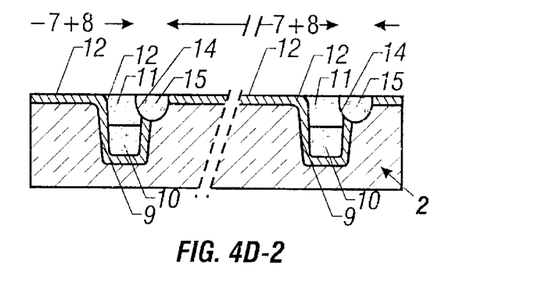

A DISCO machine was used to form channels 14, 20 μm wide and 2 to 6 μm deep, each channel lying on one of the edges of the grooves 9 which had been filled as described, thus exposing the glass in approximately one half of each channel 14. In order to restore the perfect smoothness of the plate 2, the channels 14 were then filed with a polymerizable compound 15 of insulating ink which was set at 150° C. (FIG. $4d_2$).

This produced a substrate 2 comprising conducting columns 7, separated by insulating polymer surfaces 15 and very well supplied with current by the supplementary columns 8 formed by the conducting parts 10 and 11 positioned in the corresponding grooves 9. The columns 8 are in very good electrical communication with the columns 7 owing to the contact with the layer 12 of tin oxide located in the grooves 9.

It is to be understood that the embodiments described above are not in any way restrictive and may be subjected to any desirable modifications without departure from the scope of the invention.

We claim:

1. An electrical circuit, comprising:
an insulating substrate having one or more grooves of a depth of more than 6 μm engraved into a surface of said substrate, each said groove being completely filled by at least two superimposed components, including:
a conductive material placed in a lower portion of said groove; and
a protective material placed over said conductive material for sealing said groove; and
a conducting layer covering at least part of a surface of said substrate, said conducting layer having a geometrical form corresponding to an electrical circuit layout, said conducting layer being electrically connected with said conductive material,
wherein said conductive material is disposed in the form of a precursory material and wherein said precursory material introduced into each groove is brought into its final form by drying for the purpose of evaporating water or solvents contained therein.

2. An electrical circuit, comprising:
an insulating substrate having one or more grooves of a depth of more than 6 μm engraved into a surface of said substrate, each said groove being completely filled by at least two superimposed components, including:
a conductive material placed in a lower portion of said groove; and
a protective material placed over said conductive material for sealing said groove; and
a conducting layer covering at least part of a surface of said substrate, said conducting layer having a geometrical form corresponding to an electrical circuit layout, said conducting layer being electrically connected with said conductive material,
wherein said conductive material is disposed in the form of a precursory material and wherein said precursory material introduced into each groove is brought into its final form by polymerization.

3. An electric circuit, comprising:
an insulating substrate having one or more grooves of a depth of more than 6 μm engraved into a surface of said substrate, each said groove being completely filled by at least two superimposed components, including:
a conductive material placed in a lower portion of said groove; and
a protective material placed over said conductive material for sealing said groove; and
a conducting layer covering at least part of a surface of said substrate, said conducting layer having a geometrical form corresponding to an electrical circuit layout,
wherein said conductive material is applied into said groove without forming a relief on the surface of said substrate, said electrical circuit further comprising:
means for electrically coupling said conducting layer and said conductive material,
wherein said protective material is conductive, wherein said electrically coupling means includes said protective material for electrically coupling said conductive material with said conducting layers, and
wherein said electrically coupling means includes a conductive strip disposed onto the surface of said substrate for electrically coupling said conductive material with said conducting layer.

4. An electrical circuit, comprising:
an insulating substrate having one or more grooves of a depth of more than 6 μm engraved into a surface of said substrate, each said groove being completely filled by at least two superimposed components, including:
   a conductive material placed in a bottom portion of said groove; and
   a protective material placed over said conductive material for sealing said groove; and
a conducting layer covering at least part of a surface of said substrate, said conducting layer having a geometrical form corresponding to an electrical circuit layout, said conducting layer being electrically connected with said conductive material,
   wherein said conductive material is applied into said groove without forming a relief on the surface of said substrate, and
   wherein said conducting layer further includes
a notch made through said conducting layer and in said substrate to create a discontinuity in said conducting layer by exposing said substrate.

5. An electrical circuit, comprising:
an insulating substrate having one or more grooves of a depth of more than 6 μm engraved into a surface of said substrate, each said groove being completely filled by at least two superimposed components, including:
   a conductive material placed in a bottom portion of said groove; and
   a protective material placed over said conductive material for sealing said groove; and
a conducting layer covering at least part of a surface of said substrate, said conducting layer having a geometrical form corresponding to an electrical circuit layout, said conducting layer being electrically connected with said conductive material,
wherein said substrate is flat, and wherein said grooves are rectilinear and parallel to each other and interacting with said conducting layer,
wherein said conducting layer is deposited on the substrate to coat said substrate,
wherein said conductive material is applied into said groove without forming a relief on the surface of said substrate,
wherein said protective material is conductive; and
a conductive strip disposed onto the surface of said substrate for electrically coupling said conductive material with said conducting layer, at least one groove being associated with one strip.

6. A process of fabricating an electrical circuit on the surface of an insulating substrate, the process comprising the steps of:
   (a) engraving a groove in the surface of said substrate;
   (b) disposing a conductive material into said groove;
   (c) treating said conductive material to place it in a final state;
   (d) filling said groove with a protective material after step (c);
   (e) treating said protecting material to place it in a final state after step (d); and
   (f) coating said substrate with a conductive layer,
   wherein said coating step is performed prior to step (a).

7. A process of fabricating an electrical circuit on the surface of an insulating substrate, the process comprising the steps of:
   (a) engraving a groove in the surface of said substrate;
   (b) disposing a conductive material into said groove;
   (c) treating said conductive material to place it in a final state;
   (d) filling said groove with a protective material after step (c);
   (e) treating said protecting material to place it in a final state after step (d); and
   (f) coating said substrate with a conductive layer,
   wherein said coating step is performed after step (a), but before step (b).

8. A process of fabricating an electrical circuit on the surface of an insulating substrate, the process comprising the steps of:
   (a) engraving a groove in the surface of said substrate;
   (b) disposing a conductive material into said groove;
   (c) treating said conductive material to place it in a final state;
   (d) filling said groove with a protective material after step (c);
   (e) treating said protecting material to place it in a final state after step (d); and
   (f) coating said substrate with a conductive layer,
   wherein said coating step is performed after step (c), but before step (d).

9. A process of fabricating an electrical circuit on the surface of an insulating substrate, the process comprising the steps of:
   (a) engraving a groove in the surface of said substrate;
   (b) disposing a conductive material into said groove;
   (c) treating said conductive material to place it in a final state;
   (d) filling said groove with a protective material after step (c);
   (e) treating said protecting material to place it in a final state after step (d); and
   (f) coating said substrate with a conductive layer,
   wherein said coating step is performed after step (e).

10. A process of fabricating an electrical circuit on the surface of an insulating substrate, the process comprising the steps of:
    (a) engraving a groove in the surface of said substrate;
    (b) disposing a conductive material into said groove;
    (c) treating said conductive material to place it in a final state;
    (d) filling said groove with a protective material after step (c);
    (e) treating said protecting material to place it in a final state after step (d); and
    (f) coating said substrate with a conductive layer,
    wherein said conductive material is a conductive wire, and wherein step (b) further includes covering said conductive wire with a conductive precursory material appropriate for applying into said groove.

11. A process of fabricating an electrical circuit on the surface of an insulating substrate, the process comprising the steps of:
    (a) engraving a groove in the surface of said substrate;
    (b) disposing a conductive material into said groove;
    (c) treating said conductive material to place it in a final state;
    (d) filling said groove with a protective material after step (c);
    (e) treating said protecting material to place it in a final state after step (d); and (f) coating said substrate with a conductive layer, wherein said conductive material is introduced as precursory material and then treated to impart its final properties, wherein precursory material not residing in said groove is defined as excess precursory material, the process further comprising the step of removing excess precursory material before their respective treating steps.

12. The process of claim 11, further including:

treating the surface of said substrate to make the surface non-wettable thereby causing said precursory material to flow virtually exclusively into said groove.

13. The electrical circuit of claim 4, wherein said notch includes a channel formed through said conducting layer and into an upper edge of said groove.

* * * * *